(12) United States Patent
Chen

(10) Patent No.: US 8,451,051 B2
(45) Date of Patent: May 28, 2013

(54) DUAL MODE SIGMA DELTA ANALOG TO DIGITAL CONVERTER AND CIRCUIT USING THE SAME

(75) Inventor: Yi-Lung Chen, Keelung (TW)

(73) Assignee: ISSC Technologies Corp., Hsinchu (TW)

( * ) Notice: Subject to any disclaimer, the term of this patent is extended or adjusted under 35 U.S.C. 154(b) by 64 days.

(21) Appl. No.: 13/252,981

(22) Filed: Oct. 4, 2011

(65) Prior Publication Data

US 2013/0082766 A1    Apr. 4, 2013

(51) Int. Cl.
*H03K 5/00* (2006.01)
*H03M 3/00* (2006.01)

(52) U.S. Cl.
USPC ........... 327/554; 327/337; 341/143; 341/155; 341/173

(58) Field of Classification Search
USPC .......... 327/143, 155, 156, 172, 176; 341/143, 341/155, 173
See application file for complete search history.

(56) References Cited

U.S. PATENT DOCUMENTS

| | | | | |
|---|---|---|---|---|
| 4,972,436 A | * | 11/1990 | Halim et al. | 375/247 |
| 5,461,381 A | * | 10/1995 | Seaberg | 341/143 |
| 6,225,928 B1 | | 5/2001 | Green | |
| 6,424,279 B1 | * | 7/2002 | Kim et al. | 341/143 |
| 6,954,628 B2 | | 10/2005 | Minnis et al. | |
| 7,176,817 B2 | | 2/2007 | Jensen | |
| 7,564,389 B1 | * | 7/2009 | Byrd et al. | 341/143 |
| 7,671,774 B2 | * | 3/2010 | Braswell | 341/143 |

OTHER PUBLICATIONS

Kappes, A 2.2-mW CMOS Bandpass Continuous-Time Multibit ADC With 68 dB of Dynamic Range and 1-MHz Bandwidth for Wireless Applications, IEEE Journal of Solid-State Circuits.
Tabatabaei, A Dual Channel ΣΔ ADC with 40MHz Aggregate Signal Bandwidth, 2003 IEEE International Solid-State Circuits Conference, Session 3.
Jarman, A Brief Introduction to Sigma Delta Conversion, Intersil, May 1995.
Silva-Martinez, Fundamentals of Sigma-Delta Modulators, Texas A&M University, Spring 2011.

* cited by examiner

*Primary Examiner* — Dinh T. Le
(74) *Attorney, Agent, or Firm* — Ming Chow; Sinorica, LLC

(57) ABSTRACT

The present invention provides a dual mode sigma delta analog to digital converter (ADC), which only in one hardware implementation, used for low IF and near zero IF receiver. The dual mode sigma delta ADC comprises a first switched-capacitor integrator; a second switched-capacitor integrator; a quantizer; a feedback circuit and a mode device. By switching the mode device on or off, one could easily change the configuration of the disclosed ADC to decide the receiving signal falling in low-IF or near zero IF.

11 Claims, 6 Drawing Sheets

DUAL MODE SIGMA DELTA ANALOG TO DIGITAL CONVERTER AND CIRCUIT USING THE SAME

BACKGROUND OF THE INVENTION

1. Field of the Invention

The present invention relates generally to sigma delta analog to digital converter (ADC), and more particularly, to dual mode sigma delta ADC operated for the receiver with low intermediate frequency and/or near zero intermediate frequency (NZIF).

2. Background

Sigma-delta ADCs use the feedback technique and have been known in the industry since the early 1960s. The sigma-delta technique is attractive because it achieves high resolution by precise timing instead of precisely matched on-chip components, such as resistors and capacitors used in open-loop converters. Thus, the sigma-delta technique is the technique of choice for many integrated circuit applications.

A basic sigma-delta ADC receives an analog input signal, and subtracts a feedback signal from the analog input signal to provide an error signal. The error signal is processed through a lowpass filter, and then quantized to form a digital output signal. A feedback digital-to-analog converter (DAC) provides the feedback signal after converting the digital output signal to analog form. Aside from the feedback DAC, the basic sigma-delta ADC may be implemented with conventional analog components such as operational amplifiers, comparators, and switched-capacitor filters. The basic sigma-delta ADC usually provides high resolution because integrated circuit clocking speeds allow the analog input signal to be highly over sampled. The basic sigma-delta ADC also has high signal-to-noise ratio (SNR) because the lowpass filter shapes quantization noise out-of-band, which can then be sufficiently attenuated by conventional filtering techniques.

U.S. Pat. No. 5,461,381, issued to Seaberg entitled "Sigma-delta analog-to-digital converter (ADC) with feedback compensation and method therefor" discloses a sigma-delta ADC includes first and second integrators, a quantizer connected to an output of the second integrator, and a feedback circuit connected to the output of the quantizer. In order to avoid the effects of delays through actual circuit elements, the feedback circuit keeps the feedback signal to the first integrator in a high-impedance state until the quantizer resolves the output of the second integrator. Thus, the first integrator avoids temporarily summing a possibly incorrect feedback signal. In addition, the feedback circuit also keeps the first integrator from integrating a sum of an input signal and the feedback signal until the feedback signal is driven to its correct state in response to the output of the quantizer. To accomplish these results, the feedback circuit includes a compensation circuit for continually determining when the quantizer resolves.

U.S. Pat. No. 6,225,928, issued to Green entitled "Complex bandpass modulator and method for analog-to-digital converters" discloses a discrete-time strongly cross-coupled complex bandpass modulator that achieves the full potential of bandpass delta-sigma conversion by providing a strongly cross-coupled discrete-time complex loop filter structure with very low sensitivity to mismatches and by providing a simple scheme for correcting the effects of modulator mismatches. The complex bandpass modulator includes a plurality of non-linear resonators connected together and acting as a linear complex operator. Each resonator will act as a linear complex operator when an imaginary input signal is delayed by half a sample interval and an imaginary output signal is advanced by half a sample interval. In addition, degradation effects due to modulator mismatches are eliminated by digitally adjusting the relative gain of the real and imaginary paths following the output of the analog-to-digital converter and by adjusting the relative gain of the real and imaginary input signals.

U.S. Pat. No. 6,954,628, issued to Minnis, et al. entitled "Radio receiver" discloses a radio receiver is configurable to operate in both low-IF and zero-IF modes with maximum re-use of analogue and digital circuitry between modes. The receiver comprises a quadrature down-converter for generating in-phase (I) and quadrature (Q) signals at an intermediate frequency and a complex filter for performing image rejection filtering. In the low-IF mode, one of the outputs (Q) of the filter is terminated, the other (I) is digitized by a non-complex ADC then the digital signal is filtered and decimated. Quadrature-related IF signals are then re-generated before down-conversion and demodulation. In the zero-IF mode, both outputs of the filter are digitized and processed in parallel before demodulation. By enabling analogue-to-digital conversion and channel filtering to be performed at low-IF on non-complex signals, use of just two non-complex ADCs is possible, thereby avoiding duplication of circuitry and providing significant power savings.

U.S. Pat. No. 7,176,817, issued to Jensen entitled "Continuous time delta sigma ADC with dithering" discloses a mixture of digital signal processing and analog circuitry to reduce spurious noise in continuous time delta sigma analog-to-digital (ADC) converters. Specifically, a small amount of random additive noise, also referred to as dither, is introduced into the continuous time delta sigma ADC to improve linear behavior by randomizing and de-correlating the quantization noise from the input signal without significantly degrading the signal-to-noise ratio (SNR) performance. In each of the embodiments, digital circuitry is used to generate the desired randomness, de-correlation, and spectral shape of the dither and simple analog circuit blocks are used to appropriately scale and inject the dither into the continuous time delta sigma ADC loop. In one embodiment of the invention, random noise is added to the quantizer input. In another embodiment, a relatively small amount of current is randomly added or subtracted in the feedback loop to randomize and de-correlate the quantization noise from the input signal while maintaining required signal to noise ratios.

Nowadays, Bluetooth standard expands the widely application from high speed to low energy purpose. Various structures of the radio frequency receiver have been developed to meet the requirement of the radio frequency link budget. Meanwhile, design engineer should provide different designs for this diversity of the design specification. It would be time-consuming and lose the winning point of time-to-market. For example, design engineer should need two different hardware of ADC to support low intermediate frequency (IF) and near zero intermediate frequency (NEIF) receivers individually.

Therefore, there is needed to provide a dual mode ADC, only in one hardware implementation, both for low IF and near zero IF receiver.

BRIEF SUMMARY OF THE INVENTION

It is an objective of the present invention to provide a dual mode sigma delta ADC, only in one hardware implementation, both for low IF and near zero IF receiver. By switching the "mode" device on or off, one could easily change the configuration of the disclosed ADC to decide the receiving signal falling in low-IF or near zero IF.

To achieve the above objective, the present invention provides a dual mode sigma delta ADC, it comprises a first switched-capacitor integrator, for integrating a sum of an input signal and a first feedback signal; a second switched-capacitor integrator, coupled to the first switched-capacitor integrator for integrating a sum of an output of the first switched-capacitor integrator and a second feedback signal; a quantizer, having an input terminal coupled to the second switched-capacitor integrator, and an output terminal for providing an output signal of the ADC in at least first and second logic states in response to an output of the second switched-capacitor integrator; a feedback circuit, coupled to the first switched-capacitor integrator and the second switched-capacitor integrator for providing the first feedback signal to the first switched-capacitor integrator and the second feedback signal to the second switched-capacitor integrator; and a mode device, coupled to an input terminal of the first switched-capacitor integrator and an output terminal of the second switched-capacitor integrator for providing a mode signal to control an operation of the first switched-capacitor integrator and an operation of the second switched-capacitor integrator.

According to one aspect of the present invention, the mode device comprises a first switching element having a first terminal coupled to the input terminal of the first switched-capacitor integrator and a second terminal coupled to the input terminal of the first switched-capacitor integrator; a second switching element having a first terminal coupled to the input terminal of the first switched-capacitor integrator and a second terminal; and a third switching element having a first terminal coupled to the second terminal of the second switching element of the mode device and a second terminal coupled to the output terminal of the second switched-capacitor integrator; wherein the mode device controls the first switching element, the second switching element and the third switching element to be on or off state.

Moreover, the present invention also provides a receiver circuit using the disclosed dual mode sigma delta ADC.

These and many other advantages and features of the present invention will be readily apparent to those skilled in the art from the following drawings and detailed descriptions.

BRIEF DESCRIPTION OF THE DRAWINGS

All the objects, advantages, and novel features of the invention will become more apparent from the following detailed descriptions when taken in conjunction with the accompanying drawings.

DETAILED DESCRIPTION OF THE INVENTION

Although the invention has been explained in relation to several preferred embodiments, the accompanying drawings and the following detailed descriptions are the preferred embodiment of the present invention. It is to be understood that the following disclosed descriptions will be examples of present invention, and will not limit the present invention into the drawings and the special embodiment.

Figure 1:
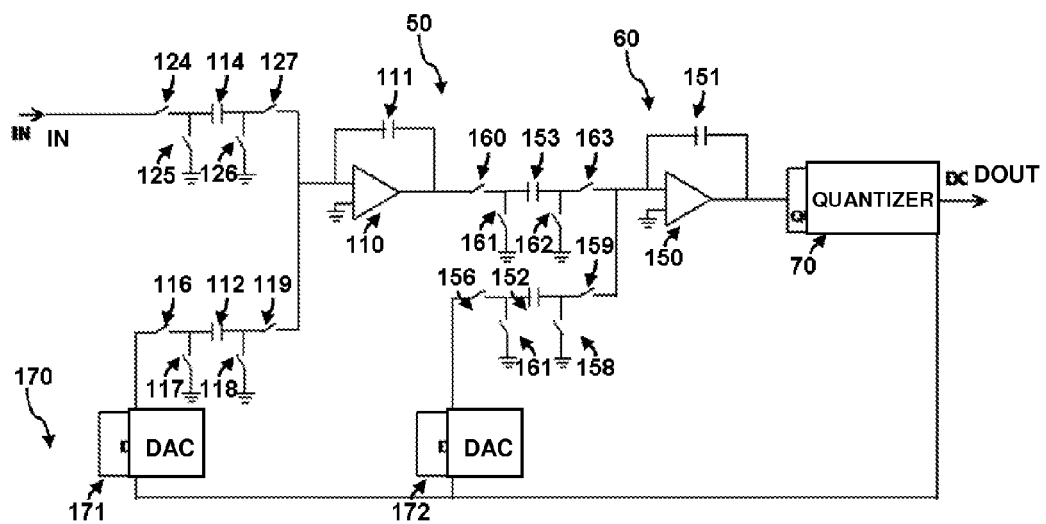
FIG. 1 shows a sigma delta analog to digital converter (ADC) according to the prior art.

To understand the spirit of the present invention, please referring to FIG. 1, it shows a sigma delta analog to digital converter (ADC) according to the prior art. The conventional sigma-delta ADC comprises a first switched-capacitor integrator 50, for integrating a sum of an input signal and a first feedback signal; a second switched-capacitor integrator 60, coupled to the first switched-capacitor integrator 50 for integrating a sum of an output of the first switched-capacitor integrator and a second feedback signal; a quantizer 70, having an input terminal coupled to the second switched-capacitor integrator 60, and an output terminal for providing an output signal (DOUT) of the ADC in at least first and second logic states in response to an output of the second switched-capacitor integrator 60; and a feedback circuit 170, 180, coupled to the first switched-capacitor integrator and the second switched-capacitor integrator for providing the first feedback signal to the first switched-capacitor integrator 50 and the second feedback signal to the second switched-capacitor integrator 60.

Theses two integrators 50, 60 and the feedback circuits 170, 180 form a noise shaping function which filter out in-band quantization noise from the quantizer 70. The switching elements present non-overlapping clock controlled switches together with the capacitors which form an integrator by means of general switch-capacitor operating circuits. The signal transfer function of this sigma delta ADC is a low pass type and noise transfer function is a high pass type. This type of ADC take the advantage of over sample ratio and high-pass noise shaping function, getting high signal-to-noise ratio for the usage of common communication device. However, design engineer should need two different hardware of ADC to support low intermediate frequency (IF) and near zero intermediate frequency (NZIF) receivers individually. It is time-consuming and loses the winning point of time-to-market.

Figure 2:
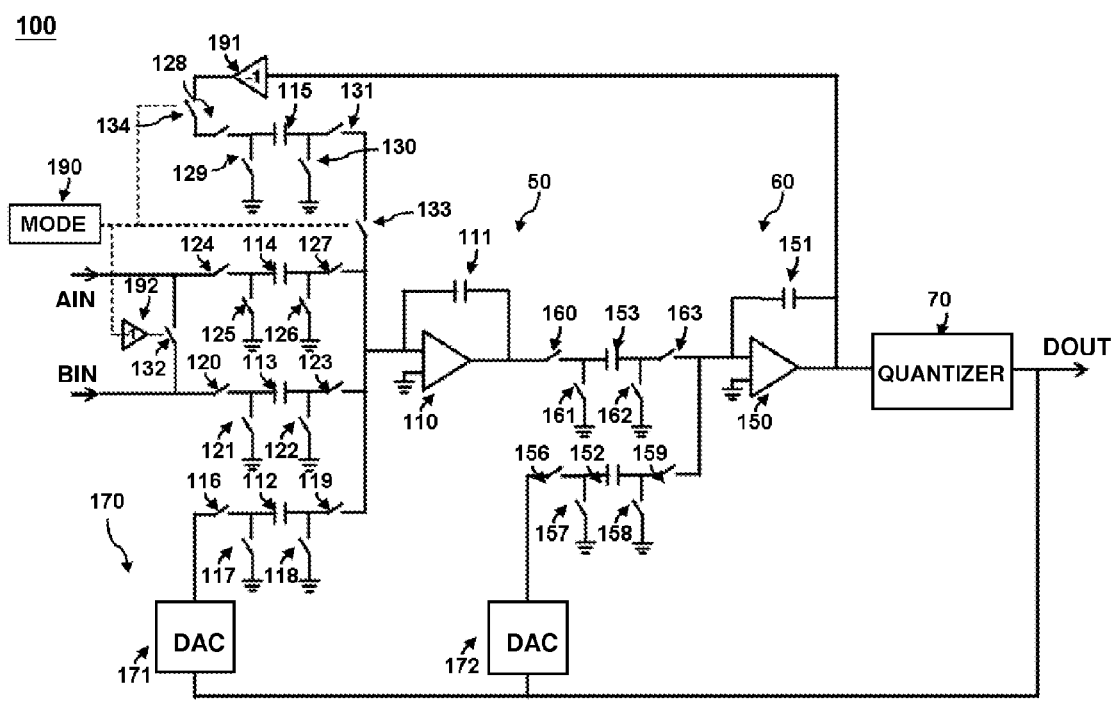
FIG. 2 shows the disclosed dual mode sigma delta ADC according to the present invention.

Please referring to FIG. 2, it shows the disclosed dual mode sigma delta analog to digital converter (ADC) according to the present invention. The dual mode sigma-delta ADC 100 comprises a first switched-capacitor integrator 50; a second switched-capacitor integrator 60; a quantizer 70; a feedback circuit 170; a mode device 190.

The first switched-capacitor integrator 50 is used for integrating a sum of an input signal and a first feedback signal. The second switched-capacitor integrator 60 is coupled to the first switched-capacitor integrator 50 for integrating a sum of an output of the first switched-capacitor integrator 50 and a second feedback signal. The quantizer 70 has an input terminal coupled to the second switched-capacitor integrator 60, and an output terminal for providing an output signal (DOUT) of the ADC in at least first and second logic states in response to an output of the second switched-capacitor integrator 60. The feedback circuit 170 is coupled to the first switched-capacitor integrator 50 and the second switched-capacitor integrator 60 for providing the first feedback signal to the first switched-capacitor integrator 50 and the second feedback signal to the second switched-capacitor integrator 60. The mode device 190 is coupled to an input terminal of the first switched-capacitor integrator 50 and an output terminal of the second switched-capacitor integrator 60 for providing a mode signal to control an operation of the first switched-capacitor integrator 50 and an operation of the second switched-capacitor integrator 60.

The feedback circuit 170 includes a first digital-to-analog converter (DAC) 171, a second digital-to-analog converter (DAC) 172, eight switching elements 116~119, 156~159, and two capacitors 112, 152. The first digital-to-analog converter (DAC) 171 has a first terminal coupled to the output terminal of the quantizer 70 and a second terminal coupled to the input terminal of the first switched-capacitor integrator 50, through the switching elements 116~119 and the capacitors 112, for providing the first feedback signal to the first switched-capacitor integrator 50. The second digital-to-analog converter (DAC) 172 has a first terminal coupled to the output terminal of the quantizer 70 and a second terminal coupled to the input terminal of the second switched-capacitor integrator 60, through the switching elements 156~159 and the capacitors 152, for providing the first feedback signal to the first switched-capacitor integrator 60. The switching element 116 has a first terminal coupled to the output terminal of the first digital-to-analog converter (DAC) 171 and a second terminal. The switching element 117 has a first terminal coupled to the second terminal of the switching element 116 and a second terminal coupled to the ground. The capacitor 112 has a first terminal coupled to the first terminal of the switching element 117 and a second terminal. The switching element 118 has a first terminal coupled to the second terminal of the capacitor 112 and a second terminal coupled to the ground. The switching element 119 has a first terminal coupled to the second terminal of the capacitor 112 and a second terminal coupled to the input terminal of the fully-differential operational amplifier 110 of the first switched-capacitor integrator 50. The switching element 156 has a first terminal coupled to the output terminal of the second digital-to-analog converter (DAC) 172 and a second terminal. The switching element 157 has a first terminal coupled to the second terminal of the switching element 156 and a second terminal coupled to the ground. The capacitor 152 has a first terminal coupled to the first terminal of the switching element 157 and a second terminal. The switching element 158 has a first terminal coupled to the second terminal of the capacitor 152 and a second terminal coupled to the ground. The switching element 159 has a first terminal coupled to the second terminal of the capacitor 152 and a second terminal coupled to the input terminal of the fully-differential operational amplifier 150 of the first switched-capacitor integrator 60.

The mode device 190 comprises three switching elements 132~134, a capacitor 115, four switching elements 128~131 and two inverters 191~192. The switching element 132 has a first terminal coupled to the input terminal of the first switched-capacitor integrator 50 through a plurality of capacitor 113 and four switching elements 120~123, and a second terminal coupled to the input terminal of the first switched-capacitor integrator 50 through a plurality of capacitor 114 and four switching elements 124~127. The switching element 133 has a first terminal coupled to the input terminal of the first switched-capacitor integrator 50 and a second terminal. The switching element 134 has a first terminal and a second terminal. The inverter 191 has a first terminal coupled to the output terminal of the second switched-capacitor integrator 60 and a second terminal coupled to first terminal of the switching element 134. The inverter 192 has a first terminal coupled to the switching element 132 and a second terminal coupled to the switching element 133, 134. The switching element 128 has a first terminal coupled to the second terminal of the switching element 134 and a second terminal. The switching element 129 has a first terminal coupled to the second terminal of the switching element 128 and a second terminal. The capacitor 115 has a first terminal coupled to the second terminal of the switching element 129 and a second terminal. The switching element 130 has a first terminal coupled to the second terminal of the capacitor 115 and a second terminal coupled to the ground. The switching element 131 has a first terminal coupled to the second terminal of the capacitor 152 and a second terminal coupled to the second terminal of the switching element 133. The mode device 190 controls the first switching element 132, the second switching element 133 and the third switching element 134 to be on or off state.

The first switched-capacitor integrator 50 comprises a fully-differential operational amplifier 110, a capacitor 111, eight switching elements 120~123, 124~127, and two capacitors 113, 114.

The fully-differential operational amplifier 110 has a first input terminal coupled to the second terminal of the switching element 119, 133, a second input terminal coupled to the ground and an output terminal. The first capacitor 111 has a first terminal coupled to the first input terminal of the fully-differential operational amplifier 110 of the first switched-capacitor integrator 50, a second terminal coupled to the output terminal of the fully-differential operational amplifier 110 of the first switched-capacitor integrator 50.

The switching element 120 has a first terminal coupled to the first terminal of the switching element 102 and a second terminal. The switching element 121 has a first terminal coupled to the second terminal of the switching element 120 and a second terminal. The capacitor 113 has a first terminal coupled to the second terminal of the switching element 113 and a second terminal. The switching element 114 has a first terminal coupled to the second terminal of the capacitor 113 and a second terminal coupled to the ground. The switching element 123 has a first terminal coupled to the second terminal of the capacitor 113 and a second terminal coupled to the first input terminal of the fully-differential operational amplifier 110.

The switching element 124 has a first terminal coupled to the second terminal of the switching element 102 and a second terminal. The switching element 125 has a first terminal coupled to the second terminal of the switching element 124 and a second terminal. The capacitor 114 has a first terminal coupled to the second terminal of the switching element 125 and a second terminal. The switching element 126 has a first terminal coupled to the second terminal of the capacitor 114 and a second terminal coupled to the ground. The switching element 127 has a first terminal coupled to the second terminal of the capacitor 114 and a second terminal coupled to the first input terminal of the fully-differential operational amplifier 110.

The second switched-capacitor integrator 60 comprises a fully-differential operational amplifier 150, a capacitor 151, four switching elements 160~163, and a capacitor 153.

The fully-differential operational amplifier 150 has a first input terminal coupled to the second terminal of the switching element 159,163, a second input terminal coupled to the ground and an output terminal. The first capacitor 151 has a first terminal coupled to the first input terminal of the fully-differential operational amplifier 150 of the first switched-capacitor integrator 60, a second terminal coupled to the output terminal of the fully-differential operational amplifier 150 of the first switched-capacitor integrator 60 and the input terminal of the quantizer 70.

The switching element 160 has a first terminal coupled to the output terminal of the fully-differential operational amplifier 110 and a second terminal. The switching element 161 has a first terminal coupled to the second terminal of the switching element 160 and a second terminal. The capacitor 153 has a first terminal coupled to the second terminal of the switching element 161 and a second terminal. The switching element 162 has a first terminal coupled to the second terminal of the capacitor 153 and a second terminal coupled to the ground. The switching element 163 has a first terminal coupled to the second terminal of the capacitor 153 and a second terminal coupled to the first input terminal of the fully-differential operational amplifier 150.

In this invention, two input AIN and BIN nodes are provided to transfer signals for the sigma-delta ADC 100 and another input MODE signal from the mode device 190 is to decide what operation mode of the sigma-delta ADC 100 is. When MODE signal is equal to 0, the sigma-delta ADC 100 operates on near zero IF (NZIF) mode; when MODE signal is equal to 1, the sigma-delta ADC 100 operates on low IF mode.

Figure 3:
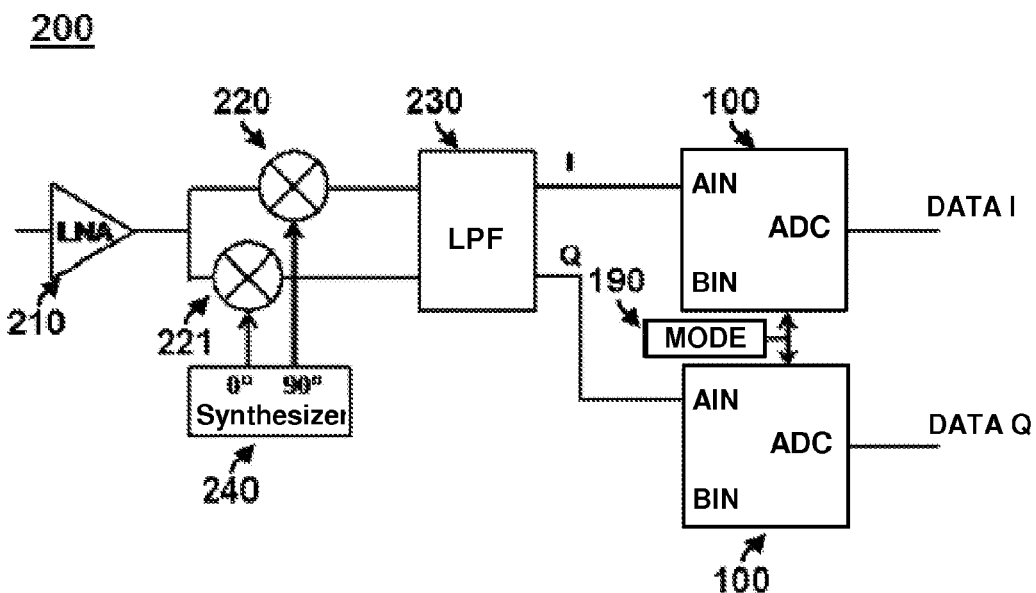
FIG. 3 shows the block diagrams of receiver circuit combined with the disclosed dual mode sigma delta ADC operating for near zero IF.

Please referring to FIG. 3, it shows the block diagrams of receiver circuit 200 combined with the disclosed dual mode sigma delta ADC operating for near zero IF. The radio frequency receiver architecture is widely used nowadays. The receiver circuit 200 comprises a low noise amplifier 210; a synthesizer 240; a first mixer 220; a second mixer 221; a lowpass filter 231, a first dual mode sigma-delta ADC 100 (as disclosed in claim 1), and a second output terminal coupled to a second dual mode sigma-delta ADC 100 (as disclosed in claim 1). It is noted that even the mode device 190 is existed in the dual mode sigma-delta ADC 100, it is also appeared independently in the receiver circuit 200 of FIG. 3 to clear the description.

Low noise amplifier (LNA) 210 amplifies a received weak signal and then pass through the mixers 220, 221 stage followed by the low pass filter (LPF) 230 which filters out out-band interference. The synthesizer 240 has a first output terminal for providing a first signal to the mixer 220 and a second output terminal for providing a second signal to the mixer 221. The first mixer 220 has a first input terminal coupled to the output terminal of the low noise amplifier 210, a second input terminal coupled to the first input terminal of the synthesizer 240, and an output terminal. The second mixer 221 has a first input terminal coupled to the output terminal of the low noise amplifier 210, a second input terminal coupled to the second input terminal of the synthesizer 240, and an output terminal. The lowpass filter 230 has a first input terminal coupled to the output terminal of the first mixer 220, a second input terminal coupled to the output terminal of the second mixer 221, a first output terminal coupled to a first dual mode sigma-delta ADC 100 (in the top) and a second output terminal coupled to a second dual mode sigma-delta ADC 100 (in the bottom). The down-converted I and Q signal from the low pass filter (LPF) 230 are transferred to the input AIN and BIN nodes to pass through the proposed ADC 100 separately, however only 'AIN' input node should be used. It shall be noted that the two ADCs (shown in top and bottom of the FIG. 3) presented here for DATA I and DATA Q are identical, namely one ADC processing I signal and the other one processing Q signal.

Figure 4:
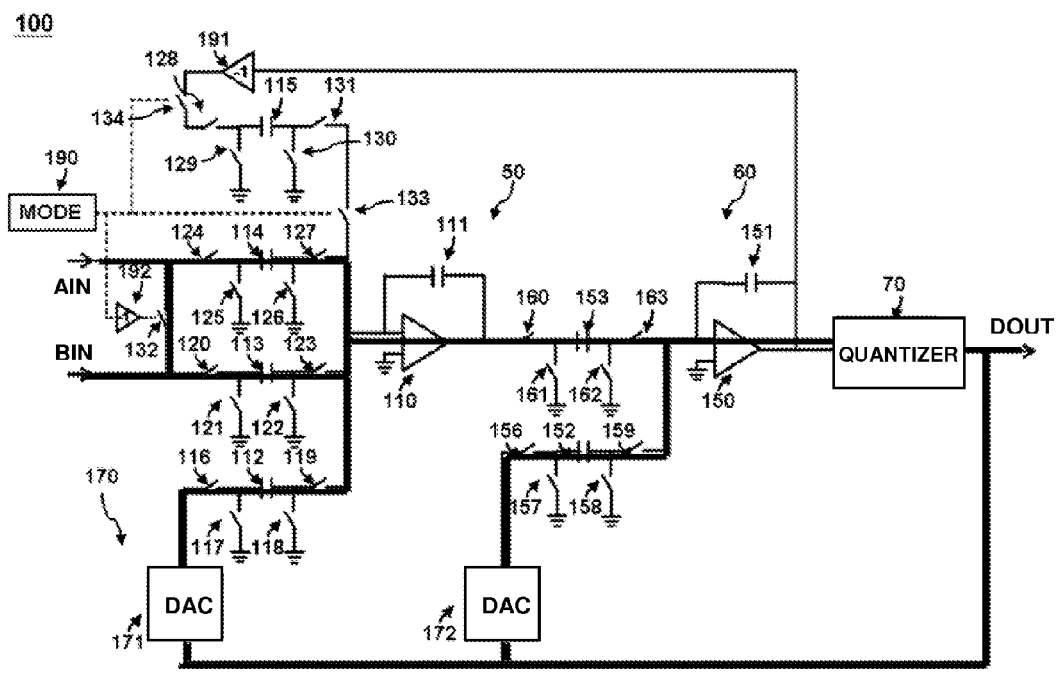
FIG. 4 shows the signal flow in the disclosed dual mode sigma delta ADC operating for near zero IF.

FIG. 4 shows the signal flow in the disclosed dual mode sigma delta ADC 100 operating for near zero IF. When MODE signal of the mode device 190 is equal to 0 and the sigma-delta ADC 100 operates on near zero IF (NZIF) mode, the switching elements 133, 134 should be off, and the upper feedback path should be broken, as shown in FIG. 4. Meanwhile, the switching elements 132 should be on, and input signals AIN is equal to BIN. So we could use either one input node as signal feed-in. In this configuration, the sigma-delta ADC 100 has a high pass noise transfer function which zero point located on origin frequency.

Figure 5:
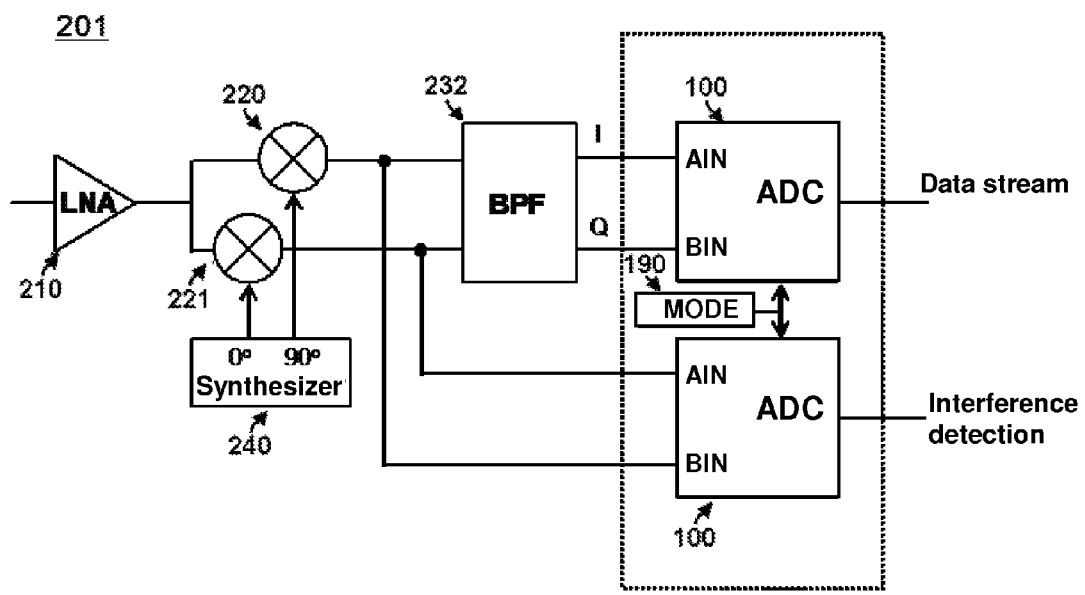
FIG. 5 shows the block diagrams of receiver circuit combined with the disclosed dual mode sigma delta ADC operating for low IF.

Please referring to FIG. 5, it shows the block diagrams of receiver circuit 201 combined with the disclosed dual mode sigma delta ADC 100 operating for low IF. The same receiver structure comprises the low noise amplifier 210 and the mixer blocks 220, 221, but connected with a complex band pass filter (BPF) 232 and two proposed dual mode sigma delta ADCs 100. It is also noted that even the mode device 190 is existed in the dual mode sigma-delta ADC 100, it is also appeared independently in the receiver circuit 200 of FIG. 3 to clear the description. The synthesizer 240 has a first output terminal for providing a first signal to the mixer 220 and a second output terminal for providing a second signal to the mixer 221. The first mixer 220 has a first input terminal coupled to the output terminal of the low noise amplifier 210, a second input terminal coupled to the first input terminal of the synthesizer 240, and an output terminal. The second mixer 221 has a first input terminal coupled to the output terminal of the low noise amplifier 210, a second input terminal coupled to the second input terminal of the synthesizer 240, and an output terminal. The bandpass filter 232 has a first input terminal coupled to the output terminal of the first mixer 220, a second input terminal coupled to the output terminal of the second mixer 221, a first output terminal coupled to a first dual mode sigma-delta ADC 100 (in the top) and a second output terminal coupled to a second dual mode sigma-delta ADC 100 (in the bottom).

The down converted signal before the bandpass filter 232 would have the interference energy and could be interpret by the second dual mode sigma delta ADC 100 (in the bottom). The second dual mode sigma delta ADC 100 has an interference detection to monitor the receiving signal, once the interference of the receiving signal is large and could be harmful to the linearity limitation of the bandpass filter 232. The baseband processor acknowledge this information by calculating interference detection signal and then notice the low noise amplifier 210 to lower the gain for avoiding interference to saturate the band pass filter (BPF) 232. In the mean time, the first sigma delta ADC 100 (in the top) would receive normal I and Q path down-converted signal from band pass filter (BPF) 232 then translating to digital code words as the DATA stream reading by baseband processor. Namely, even the first dual mode sigma delta ADC 100 (in the top) and the second dual mode sigma delta ADC 100 (in the bottom) have the same devices, they receive different signals when MODE signal of the mode device 190 is equal to 1 and the dual mode sigma delta ADC 100 operates on low IF mode.

Figure 6:
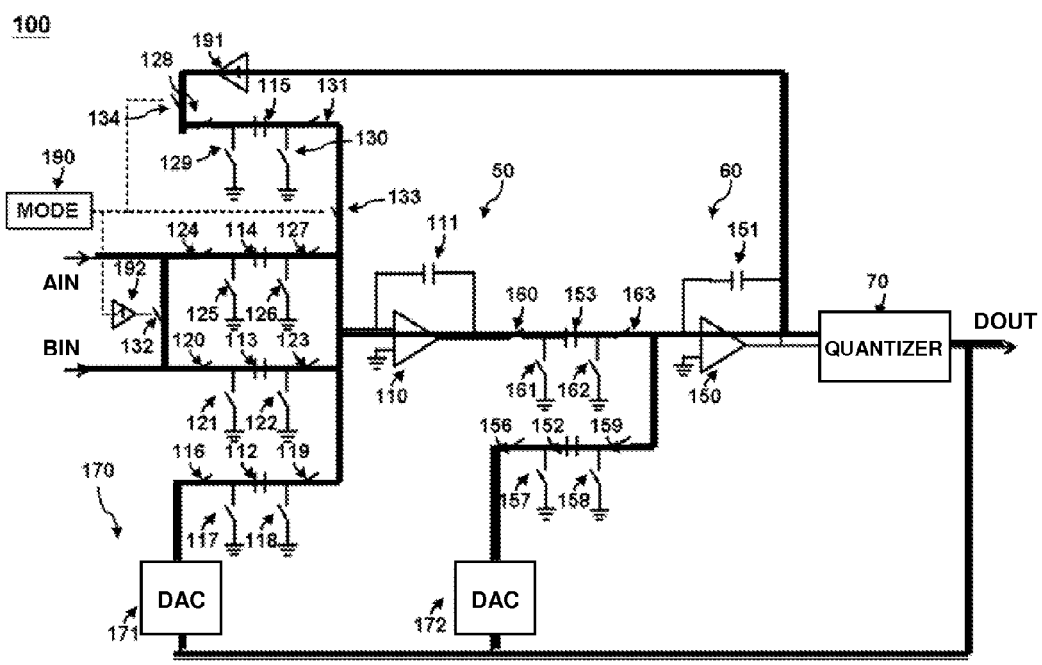
FIG. 6 shows the signal flow in the disclosed dual mode sigma delta ADC operating for low IF.

Please referring to FIG. 6, it shows the signal flow in the disclosed dual mode sigma delta ADC operating for low IF. When MODE signal of the mode device 190 is equal to 1 and the dual mode sigma delta ADC 100 operates on low IF mode, the switching elements 133, 134 should be on and the switching element 132 should be off in this time, as shown in FIG. 6. The upper feedback path now is connect, hence the sigma-delta ADC 100 has a high-pass noise transfer function which zero point located at IF frequency. In this configuration 'AIN' and 'BIN' processing individual signal and the switch-capacitor operation just make input signals summarized as 'AIN+BIN' nodes.

The functions and the advantages of the present invention have been shown. Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A dual mode sigma-delta analog-to-digital converter (ADC) comprising:

a first switched-capacitor integrator, for integrating a sum of an input signal and a first feedback signal;

a second switched-capacitor integrator, coupled to the first switched-capacitor integrator for integrating a sum of an output of the first switched-capacitor integrator and a second feedback signal;

a quantizer, having an input terminal coupled to the second switched-capacitor integrator, and an output terminal for providing an output signal of the ADC in at least first and second logic states in response to an output of the second switched-capacitor integrator;

a feedback circuit, coupled to the first switched-capacitor integrator and the second switched-capacitor integrator for providing the first feedback signal to the first switched-capacitor integrator and the second feedback signal to the second switched-capacitor integrator; and a mode device, coupled to an input terminal of the first switched-capacitor integrator and an output terminal of the second switched-capacitor integrator for providing a mode signal to control an operation of the first switched-capacitor integrator and an operation of the second switched-capacitor integrator.

2. The dual mode sigma-delta ADC of claim 1, wherein the feedback circuit includes
  a first digital-to-analog converter (DAC), coupled to the input terminal of the first switched-capacitor integrator for providing the first feedback signal to the first switched-capacitor integrator; and
  a second digital-to-analog converter (DAC), coupled to the input terminal of the second switched-capacitor integrator for providing the second feedback signal to the second switched-capacitor integrator.

3. The dual mode sigma-delta ADC of claim 1, wherein the mode device comprises:
  a first switching element having a first terminal coupled to the input terminal of the first switched-capacitor integrator and a second terminal coupled to the input terminal of the first switched-capacitor integrator;
  a second switching element having a first terminal coupled to the input terminal of the first switched-capacitor integrator and a second terminal; and
  a third switching element having a first terminal coupled to the second terminal of the second switching element of the mode device and a second terminal coupled to the output terminal of the second switched-capacitor integrator;
  wherein the mode device controls the first switching element, the second switching element and the third switching element to be on or off state.

4. The dual mode sigma-delta ADC of claim 3, wherein between the second switching element and the third switching element, the mode device further comprises:
  a fourth switching element having a first terminal coupled to the second terminal of the third switching element and a second terminal;
  a fifth switching element having a first terminal coupled to the second terminal of the fourth switching element and a second terminal coupled to the ground;
  a first capacitor having a first terminal coupled to the first terminal of the fifth switching element and a second terminal;
  a sixth switching element having a first terminal coupled to the second terminal of the first capacitor and a second terminal coupled to the ground; and
  a seventh switching element having a first terminal coupled to the first terminal of the sixth switching element and a second terminal coupled to the second terminal of the second switching element.

5. The dual mode sigma-delta ADC of claim 1, wherein the first switched-capacitor integrator comprises:
  a fully-differential operational amplifier, having a first input terminal coupled to the first terminal of the second switching element of the mode device, a second input terminal coupled to the ground and an output terminal; and
  a first capacitors, having a first terminal coupled to the first input terminal of the fully-differential operational amplifier of the first switched-capacitor integrator, a second terminal coupled to the output terminal of the fully-differential operational amplifier of the first switched-capacitor integrator.

6. The dual mode sigma-delta ADC of claim 5, wherein the first switched-capacitor integrator further comprises:
  a first switching element having a first terminal coupled to the first terminal of the first switching element and a second terminal;
  a second switching element having a first terminal coupled to the second terminal of the first switching element and a second terminal coupled to the ground;
  a second capacitor having a first terminal coupled to the first terminal of the second switching element and a second terminal;
  a third switching element having a first terminal coupled to the second terminal of the second capacitor and a second terminal coupled to the ground;
  a fourth switching element having a first terminal coupled to the second terminal of the third switching element and a second terminal coupled to the input terminal of the fully-differential operational amplifier of the first switched-capacitor integrator;
  a fifth switching element having a first terminal coupled to the second terminal of the first switching element and a second terminal;
  a sixth switching element having a first terminal coupled to the second terminal of the fifth switching element and a second terminal coupled to the ground;
  a third capacitor having a first terminal coupled to the second terminal of the sixth switching element and a second terminal;
  a seventh switching element having a first terminal coupled to the second terminal of the third capacitor and a second terminal coupled to the ground;
  a eighth switching element having a first terminal coupled to the seventh terminal of the seventh switching element and a second terminal coupled to the input terminal of the fully-differential operational amplifier of the first switched-capacitor integrator.

7. The dual mode sigma-delta ADC of claim 1, wherein the second switched-capacitor integrator comprises:
  a fully-differential operational amplifier, having a first input terminal, a second input terminal coupled to the ground and an output terminal coupled to the input terminal of the quantizer; and
  a first capacitor, having a first terminal coupled to the first input terminal of the fully-differential operational amplifier of the second switched-capacitor integrator, a second terminal coupled to the output terminal of the fully-differential operational amplifier.

8. The dual mode sigma-delta ADC of claim 7, wherein the second switched-capacitor integrator further comprises:

a first switching element having a first terminal coupled to the first terminal of the output terminal of the fully-differential operational amplifier and a second terminal;

a second switching element having a first terminal coupled to the second terminal of the first switching element and a second terminal coupled to the ground;

a second capacitor having a first terminal coupled to the first terminal of the second switching element and a second terminal;

a third switching element having a first terminal coupled to the second terminal of the second capacitor and a second terminal coupled to the ground;

a fourth switching element having a first terminal coupled to the second terminal of the third switching element and a second terminal coupled to the input terminal of the fully-differential operational amplifier of the second switched-capacitor integrator.

9. The dual mode sigma-delta ADC of claim 3, wherein the first switching element of the mode device is turned on, the second switching element and the third switching element of the mode device are turned off for the dual mode sigma-delta ADC operated in a mode of near zero intermediate frequency (NZIF).

10. The dual mode sigma-delta ADC of claim 3, wherein the first switching element of the mode device is turned off, the second switching element and the third switching element of the mode device are turned on for the dual mode sigma-delta ADC operated in a mode of low intermediate frequency.

11. A receiver circuit comprising:
a low noise amplifier, having an output terminal;
a synthesizer, having a first output terminal for providing a first signal and a second output terminal for providing a second signal;
a first mixer, having a first input terminal coupled to the output terminal of the low noise amplifier, a second input terminal coupled to the first input terminal of the synthesizer, and an output terminal;
a second mixer, having a first input terminal coupled to the output terminal of the low noise amplifier, a second input terminal coupled to the second input terminal of the synthesizer, and an output terminal;
a lowpass filter, having a first input terminal coupled to the output terminal of the first mixer, a second input terminal coupled to the output terminal of the second mixer, a first output terminal coupled to a first dual mode sigma-delta ADC as disclosed in claim 1, and a second output terminal coupled to a second dual mode sigma-delta ADC as disclosed in claim 1.

* * * * *